(12) United States Patent
Nagler et al.

(10) Patent No.: US 10,859,534 B2
(45) Date of Patent: Dec. 8, 2020

(54) SYSTEM AND METHOD FOR EXAMINING SEMICONDUCTOR SUBSTRATES

(71) Applicant: Infineon Technologies AG, Neubiberg (DE)

(72) Inventors: Oliver Nagler, Munich (DE); Sebastian Bernrieder, Regensburg (DE); Marianne Unterreitmeier, Woerth (DE)

(73) Assignee: Infineon Technologies AG, Neubiberg (DE)

( * ) Notice: Subject to any disclaimer, the term of this patent is extended or adjusted under 35 U.S.C. 154(b) by 98 days.

(21) Appl. No.: 16/211,991

(22) Filed: Dec. 6, 2018

(65) Prior Publication Data

US 2019/0178848 A1 Jun. 13, 2019

(30) Foreign Application Priority Data

Dec. 7, 2017 (DE) .......................... 10 2017 222 198

(51) Int. Cl.
*G01N 29/04* (2006.01)
*G01R 31/28* (2006.01)
*G01N 29/14* (2006.01)

(52) U.S. Cl.
CPC ........... *G01N 29/14* (2013.01); *G01N 29/045* (2013.01); *G01R 31/2831* (2013.01); *G01N 2291/2697* (2013.01)

(58) Field of Classification Search
CPC ................ G01N 29/045; G01N 29/14; G01N 2291/2697; G01R 31/2831
USPC .......................................................... 73/587
See application file for complete search history.

(56) References Cited

U.S. PATENT DOCUMENTS

| 4,856,326 | A | | 8/1989 | Tsukamoto | |
|---|---|---|---|---|---|
| 5,358,296 | A | * | 10/1994 | Kilmer | B65G 47/908 294/119.3 |
| 6,339,958 | B1 | * | 1/2002 | Tsui | G01N 3/42 73/150 A |
| 6,520,004 | B1 | * | 2/2003 | Lin | G01N 3/46 73/81 |
| 6,799,472 | B2 | * | 10/2004 | Nakayama | G01N 3/42 702/33 |
| 6,938,465 | B2 | * | 9/2005 | Goto | G01N 29/14 73/801 |

(Continued)

FOREIGN PATENT DOCUMENTS

| CZ | 002014846 | * | 3/2016 |
|---|---|---|---|
| DE | 297 17 736 | | 7/1998 |

(Continued)

*Primary Examiner* — Jacques M Saint Surin
(74) *Attorney, Agent, or Firm* — Dicke, Billig & Czaja, PLLC

(57) ABSTRACT

A system for examining semiconductor substrates may comprise an indenter configured to exercise a force onto the semiconductor substrate such that a crack in the semiconductor substrate occurs, a piezoelectric acoustic emission sensor configured to detect an acoustic signal emitted by the crack, and attaching means configured to fasten the indenter to a first surface of the piezoelectric acoustic emission sensor. The indenter and the attaching means are configured to transmit the acoustic signal to the piezoelectric acoustic emission sensor. The resonance frequencies of the indenter and the piezoelectric acoustic emission sensor are attuned to one another.

19 Claims, 3 Drawing Sheets

(56) References Cited

U.S. PATENT DOCUMENTS

| | | | | |
|---|---|---|---|---|
| 2003/0140710 A1* | 7/2003 | Nakayama | ............ | G01N 27/62 |
| | | | | 73/841 |
| 2004/0075796 A1* | 4/2004 | Nair | ................. | G02B 5/3016 |
| | | | | 349/117 |
| 2013/0166214 A1* | 6/2013 | Bellin | ................. | G01N 29/14 |
| | | | | 702/9 |

FOREIGN PATENT DOCUMENTS

| | | | |
|---|---|---|---|
| JP | H01316632 | | 12/1989 |
| JP | 02078932 | * | 3/1990 |
| KR | 2014-0022636 | * | 2/2014 |
| RU | 002147735 C1 | * | 4/2000 |
| WO | 96/10737 | | 4/1996 |
| WO | WO2015178821 | * | 11/2015 |

* cited by examiner

SYSTEM AND METHOD FOR EXAMINING SEMICONDUCTOR SUBSTRATES

CROSS-REFERENCE TO RELATED APPLICATION

This Utility Patent Application claims priority to German Patent Application No. 10 2017 222 198.4, filed Dec. 7, 2017, which is incorporated herein by reference.

TECHNICAL FIELD

This disclosure relates in general to a system for examining semiconductor substrates and to a method for examining semiconductor substrates.

BACKGROUND

Semiconductor substrates may need to be tested during or after the fabrication process. Such a testing may comprise among other things an electrical testing, wherein an electrical examination tool is electrically coupled to a contact pad on the semiconductor substrate and a circuit in the semiconductor substrate is electrically tested. Coupling the examination tool to the contact pad may comprise bringing a test pin into contact with the contact pad in order to establish a connection. The test pin may exert a certain force onto the semiconductor substrate when the pin contacts the contact pad and if this force is too high, a mechanical failure in the semiconductor substrate, e.g. a crack, may occur. Such a crack in turn may cause an electrical failure, e.g. because the crack provides a leakage path. It may therefore be necessary to check for cracks before the semiconductor substrate is delivered to the customer, although such a check may be time consuming and increase the costs of the fabrication process. For these and other reasons, there is a need for an improved system and an improved method for examining semiconductor substrates.

SUMMARY

Various aspects pertain to system for examining semiconductor substrates, the system comprising an indenter configured to exercise a force onto the semiconductor substrate such that a crack in the semiconductor substrate occurs, a piezoelectric acoustic emission sensor configured to detect an acoustic signal emitted by the crack, and attaching means configured to fasten the indenter to a first surface of the piezoelectric acoustic emission sensor, wherein the indenter and the attaching means are configured to transmit the acoustic signal to the piezoelectric acoustic emission sensor, and wherein the resonance frequencies of the indenter and the piezoelectric acoustic emission sensor are attuned to one another.

Various aspects pertain to a method for examining a semiconductor substrate, wherein the method comprises exercising a force onto the semiconductor substrate using an indenter, such that a crack in the semiconductor substrate occurs, and detecting an acoustic signal emitted by the crack using a piezoelectric acoustic emission sensor, wherein the indenter is fastened to a first surface of the piezoelectric acoustic emission sensor using a hard glue layer, or a soft solder layer, or mechanical fixing means, wherein the indenter and the hard glue layer, or the soft solder layer, or the mechanical fixing means are configured to transmit the acoustic signal to the piezoelectric acoustic emission sensor, and wherein the resonance frequencies of the indenter and the piezoelectric acoustic emission sensor are attuned to one another.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

Figure 1:
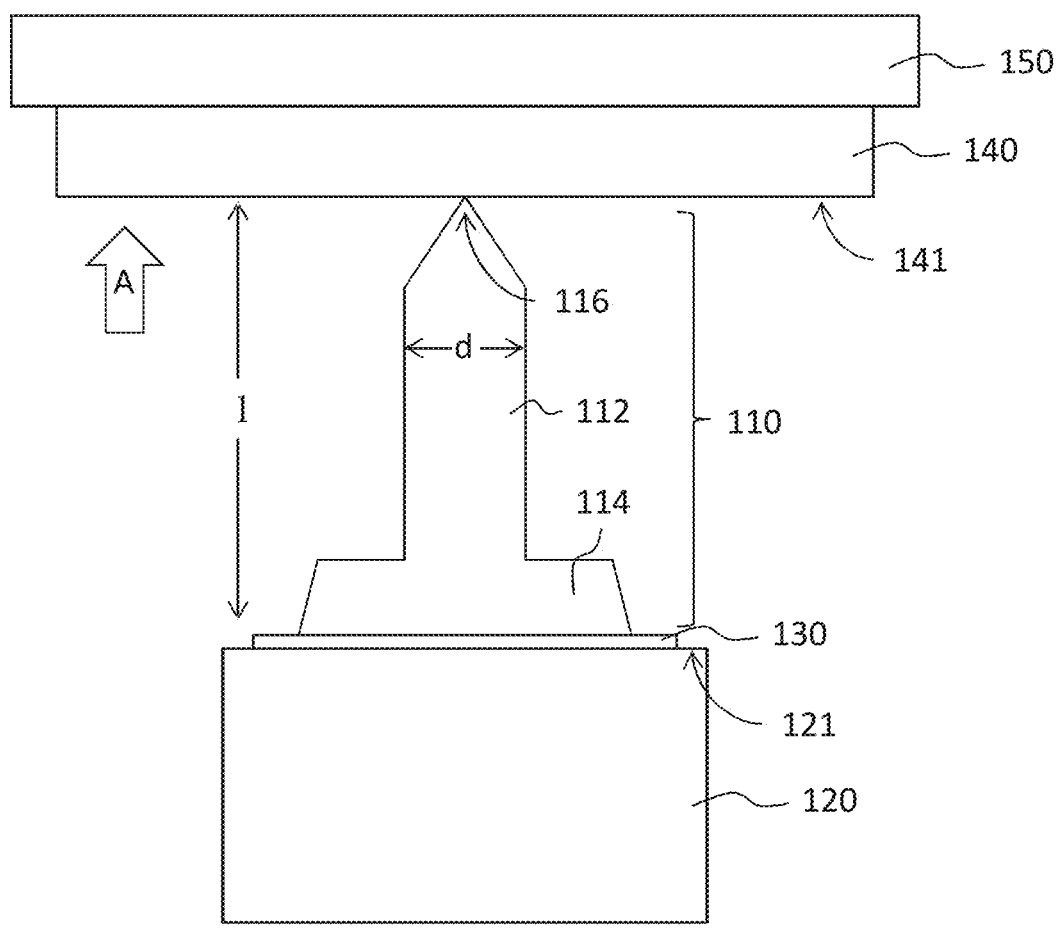
FIG. 1 schematically shows a side view of a system for examining semiconductor substrates according to the disclosure, wherein the system comprises an indenter and an acoustic emission sensor.

While a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal.

The semiconductor substrates described further below may comprise or consist of semiconductor wafers, artificial or compound wafers, or (singulated) semiconductor chips. The semiconductor substrates may comprise various types of semi-conductor chips or circuits incorporated in the semiconductor chips, among them AC/DC or DC/DC converter circuits, power MOS transistors, power schottky diodes, JFETs (Junction Gate Field Effect Transistors), power bipolar transistors, logic integrated circuits, analogue integrated circuits, mixed signal integrated circuits, sensor circuits, MEMS (Micro-Electro-Mechanical-Systems), power integrated circuits, chips with integrated passives, MOS transistor structures or vertical transistor structures like, for example, IGBT (Insulated Gate Bipolar Transistor).

The semiconductor substrates may comprise insulation materials, which may, for example, be used for providing insulation layers for electrical circuits and components. For example, the semiconductor substrates may comprise one or more electrically insulating oxide layers. The insulating layers may be arranged on a main face of the semiconductor substrates. The insulating layers may be brittle, in particular more brittle than a semiconductor mono-crystal or metal layer(s) comprised in the semiconductor substrates.

The semiconductor substrates can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor substrates may have contact pads (or electrodes) which allow electrical contact to be made with the integrated circuits included in the semiconductor substrates. The electrodes may be arranged all at only one main face of the semiconductor substrate or at both main faces of the semiconductor substrate. They may include one or more electrode metal layers which are applied to the semiconductor material of the semiconductor substrate. The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

In several examples layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

FIG. 1 shows an example of a system 100 for examining semiconductor substrates. The system 100 comprises an indenter 110 and an acoustic emission sensor 120. The system may further comprise a control component for controlling the indenter 110 and the acoustic emission sensor 120 (not shown in FIG. 1).

During examination of a semiconductor substrate 140, the semiconductor substrate 140 may be adhered to a carrier 150, e.g. by an adhesion layer, and the system 100 may e.g. be arranged below with the indenter 110 facing the semiconductor substrate 140. The carrier 150 may e.g. be a wafer chuck.

The indenter 110 may have a length 1 in the range of 10 mm to 15 mm and a diameter in the range of 0.8 mm to 1.5 mm, in particular 1 mm. The indenter 110 may comprise a tapered end opposite the acoustic emission sensor 120, wherein the tapered end comprises an indenter tip 116. The indenter tip 116 may have a minimum diameter in the range of 10 μm to 20 μm. The indenter 110 may comprise or consist of metal, for example Cu or Rh. According to an example, the indenter tip 116 comprises or consists of diamond. According to an example, the indenter 110 is electrically conductive. The indenter 110 may be rigid, meaning that it does not bend when a force is applied to the semiconductor substrate 140 via the indenter 110 as described further below.

According to an example, the indenter 110 comprises an indenter pin 112 and an indenter base 114. The indenter base 114 may be arranged on the lower end portion of the indenter 110 opposite the indenter tip 116. The indenter base 114 may have a larger diameter than the indenter pin 112. The indenter base 114 may be configured to securely fasten the indenter 110 to a first surface 121 of the acoustic emission sensor 120.

According to an example, the indenter 110 is a monolithic indenter, meaning that the indenter pin 112 (e.g. comprising the indenter tip 116) and the indenter base 114 are made of a single piece. According to another example, the indenter 110 is a compound indenter, meaning that the indenter pin 112 (e.g. comprising the indenter tip 116) and the indenter base 114 are made of a two separate pieces. Examples of a monolithic and a compound indenter are shown further below.

The indenter 110 may be configured to apply a force onto the semiconductor substrate 140, in particular onto a lower main face 141 of the semiconductor substrate 140. For example, the indenter 110 and the acoustic emission sensor 120 on which the indenter 110 is mounted are moved towards the semiconductor substrate 140 along the arrow A until the indenter 110 touches (contacts) the lower main face 141. Then, the indenter 110 and the acoustic emission sensor 120 may be further moved along the arrow A in order to exercise a force onto the semiconductor substrate 140. In this manner, sufficient force may be exercised to cause a crack in the semiconductor substrate 140. The crack may occur in a particularly brittle part of the semiconductor substrate, for example in an insulation layer like an oxide layer. The system 100 may for example be configured to apply on the semiconductor substrate 140 a force in the range of 10 mN to 400 mN.

The crack may emit an acoustic signal and the indenter 110 may be configured to transmit the acoustic signal to the acoustic emission sensor 120. The acoustic signal may be in the range of 50 kHz to 1 MHz and a maximal amplitude of the acoustic signal may be in the range of 100 kHz to 200 kHz and may for example be about 70 db to 80 dB. Transmitting the acoustic signal to the acoustic emission sensor 120 via the indenter 110 may increase the sensitivity of the acoustic emission sensor 120. Due to this increased sensitivity it may be possible to detect cracks that occur deep inside the semiconductor substrate 140, e.g. in an inner layer of the semiconductor substrate 140. A conventional acoustic emission sensor may not be sensitive enough to detect such an inner crack.

The acoustic emission sensor 120 is configured to detect the acoustic signal emitted from a crack in the semiconductor substrate 140. The acoustic emission sensor 140 may be of the piezoelectric type. The acoustic emission sensor 140 may be configured to convert the acoustic signal into an electric signal.

According to an example, the system 100 may be used to test which contact force may be exerted onto the semiconductor substrate 140 by a pin without causing a crack. During semiconductor device fabrication such pins may be used to electrically couple the semiconductor substrate to a testing equipment for electrical testing of the semiconductor device. The pins may impact on the semiconductor substrate with a certain velocity and may therefore exert a resultant force on the semiconductor substrate. Tests with the system 100 may be used to adjust the velocity such that the semiconductor substrates under test are not damaged.

As shown in FIG. 1, the indenter 110 may be arranged on an upper face 121 of the acoustic emission sensor 120, wherein the upper face 121 faces the semiconductor substrate 140. The indenter 110 may be attached to the upper face 121 by an attaching means 130. The attaching means 130 may comprise or consist of an adhesive layer like a hard glue layer, for example a layer comprising or consisting of cyanoacrylate. Herein, "hard" may have the meaning that upon curing the glue is dimensionally stable and unflexible. The attaching means 130 may be configured to efficiently transmit the acoustic signal to the acoustic emission sensor 120. In particular, a hard glue layer may be better suited for transmitting the acoustic signal than a "soft" glue layer would be. The attaching means 130 may be homogeneous and even for optimal acoustic signal transmission properties.

According to another example, the indenter 110 may be attached to the acoustic emission sensor 120 using attaching means 130 in the form of mechanical fixing means like a clamp or screws.

Figure 3A:
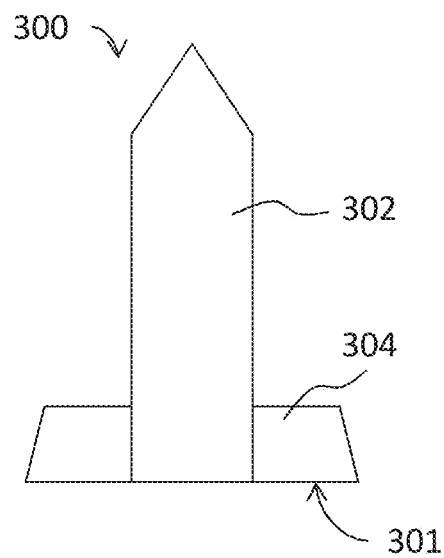
FIG. 3, which comprises the FIGS. 3A and 3B schematically shows side views of a compound indenter and a monolithic indenter according to the disclosure.

According to an example, the system 100 may be configured to be used with different types of indenters 110, wherein the different types of indenters 110 may have one or more of a different geometry, different material composition, different size etc. That is, the indenter 110 may be removable from the upper face 121 of the acoustic emission sensor 120 and another indenter 110 may be used in its place. Removing the indenter 110 may comprise cleaning off the adhesive layer 130 or unlocking the mechanical fixing means. If a compound indenter as shown in FIG. 3A is used, removing the indenter may comprise swapping the pin 302 and leaving the base 304 in place.

The indenter 110 may be arranged on the upper face 121 such that the indenter 110 is positioned in center above a sensing region of the acoustic emission sensor 120. This may improve the sensitivity of the acoustic emission sensor 120.

The resonance frequencies of the indenter 110 and the acoustic emission sensor 120 may be attuned to one another in order to improve sensor sensitivity. Attuning may comprise adapting one or more of the indenter geometry, size and material composition such that the indenter resonance frequency matches the resonance frequency of the acoustic emission sensor 120. Attuning the resonance frequencies may increase the amplitude of a detected acoustic signal of a crack by up to 10 dB. The attuned resonance frequencies of the indenter and the piezoelectric acoustic emission sensor may be in the range of 100 kHz to 200 kHz.

The system 100 may be configured to measure an electrical property of the semiconductor substrate 140. For example, the semiconductor substrate 140 may comprise an integrated circuit and the system 100 may be configured to electrically test the integrated circuit. To this end the system 100 may comprise an electrical examination component, configured to electrically examine (an integrated circuit comprised in) the semiconductor substrate 140. The indenter 110 may be configured to electrically couple the electrical examination component to an electrical contact on the semiconductor substrate 140 in order to test the integrated circuit. According to an example, the system 100 is configured to simultaneously examine the semiconductor substrate 140 acoustically and electrically.

Figure 2:
FIG. 2 schematically shows a side view of a semiconductor substrate according to the disclosure.

FIG. 2 shows an example of a semiconductor substrate 200. The semiconductor substrate 200 may be identical with the semiconductor substrate 140 shown in FIG. 1.

The semiconductor substrate 200 may be a wafer comprising a multitude of semiconductor devices for subsequent singulation and further processing or it may be a dedicated test structure. The dedicated test structure may be configured to test at which amount of force applied via the indenter 110 a crack in the test structure occurs.

The semiconductor substrate 200 may comprise different material layers, for example electrically insulating layers like oxide layers and electrically conductive layers like metal layers. The semiconductor substrate 200 may comprise an oxide (e.g. $SiO_x$) layer 202, a metal (e.g. Al or Cu) layer 204, a further oxide (e.g. $SiO_x$) layer 206 and a semiconductor (e.g. Si) body 208. According to an example, the semiconductor substrate 200 comprises a redistribution layer.

The semiconductor substrate 200 may comprise one or more contacts or contact pads arranged on the lower main face 201. During electrical testing of the semiconductor substrate 200, a pin like the indenter 110 may be brought into contact with the contact pad by pressing the pin onto the contact pad with a certain force. Real-time acoustic emission sensing as described above with respect to FIG. 1 may be used in order to verify that the semiconductor substrate 200 was not damaged (i.e. no crack appeared) when the pin was brought into contact with the contact pad.

Figure 3B:
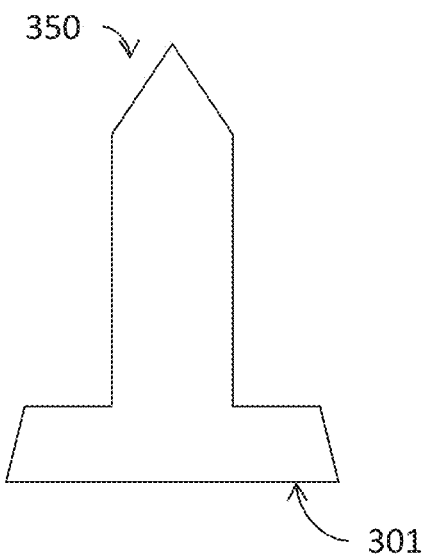

FIG. 3A shows an example of a compound indenter 300 and FIG. 3B shows an example of a monolithic indenter 350. The indenter 110 may correspond to compound indenter 300 or to monolithic indenter 350. Both indenters 300, 350 comprise an indenter pin and an indenter base. However, in the compound indenter 300 the pin 302 and the base 304 are two separate pieces, whereas in the monolithic indenter 350 the pin and the base are a single piece.

In the compound indenter 300, the pin 302 may be attached to the base 304 using attaching means like the attaching means 130; in particular a hard glue, a solder like a soft solder or mechanical fixing means may be used.

Both indenters 300 and 350 may comprise a flat lower surface 301. The flat lower surface 301 may improve the acoustic coupling of the indenter 300, 350 with the first surface 121 of the acoustic emission sensor 120.

Figure 4:
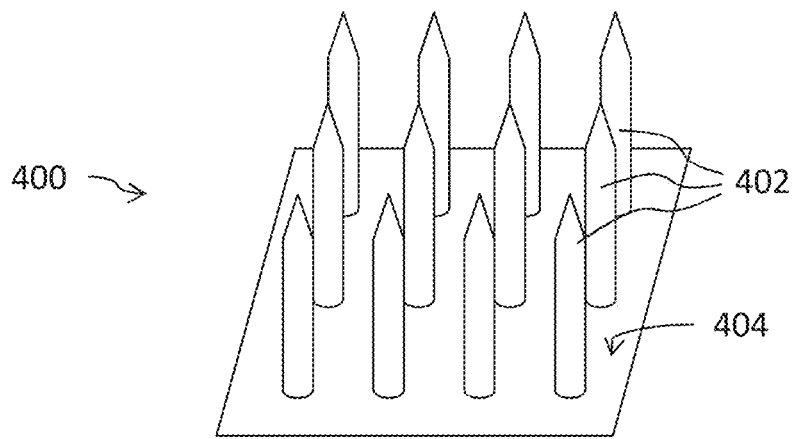
FIG. 4 schematically shows a perspective view of an array of test pins according to the disclosure.

FIG. 4 shows an array of test pins 400 for electrical testing of a semiconductor substrate like the semiconductor substrate 140. Each test pin 402 may be configured to electrically couple with a contact pad of the semiconductor substrate under testing. Each test pin 402 may be configured to acoustically couple the semiconductor substrate under testing with an acoustic emission sensor as described with respect to FIG. 1. Furthermore, each test pin 402 may correspond to an indenter like the indenters 110, 300 and 350. The array of test pins 400 may be coupled to one or more acoustic emission sensors which may be arranged below the mounting plane 404 similar to the acoustic emission sensor 120 of FIG. 1.

A system comprising the array of test pins 400 coupled to one or more acoustic emission sensors may be used for electrical testing during a fabrication process of semiconductor devices. In particular, the one or more acoustic emission sensors may be used to verify in real-time, if the semiconductor substrate gets damaged (i.e. cracks) when the pins 402 make contact with the respective contact pads. Due to this real-time inspection, it may not be necessary to perform a subsequent (time consuming) dedicated inspection step to verify that no damage was done to the semiconductor substrate.

According to an example, the array of test pins 400 may be configured to detect the position of the crack in the semiconductor substrate. For example, the array of test pins may be configured to register the amplitude of the acoustic signal emitted from the crack that each test pin 402 of the array of test pins 400 transmits to the acoustic emission sensor. The higher the amplitude the closer to the respective pin 402 the crack may be located in the semiconductor substrate. In the case that the semiconductor substrate comprises a multitude of semiconductor devices like semiconductor dies, it may therefore be possible to determine which one or which ones of the semiconductor devices are damaged (cracked) and which ones are intact and need not be rejected. This may reduce fabrication costs.

Figure 5:
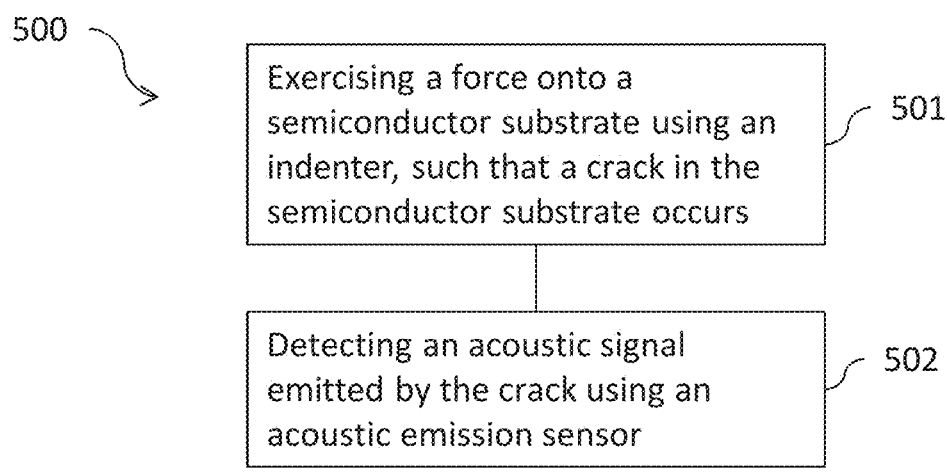
FIG. 5 shows a flow chart of a method for examining a semiconductor substrate according to the disclosure.

FIG. 5 shows a flow chart of a method 500 for examining a semiconductor substrate. According to an example, anyone of the system 100, the indenters 300 and 350 or the array of test pins 400 may be used in the method 500.

The method 500 comprises a first act 501 of exercising a force onto the semiconductor substrate using an indenter, such that a crack in the semiconductor substrate occurs. The method 500 further comprises a second act 502 of detecting an acoustic signal emitted by the crack using a (piezoelectric) acoustic emission sensor. The indenter may be fastened to a first surface of the piezoelectric acoustic emission sensor using a hard glue layer. The indenter and the hard glue layer may be configured to transmit the acoustic signal to the piezoelectric acoustic emission sensor. The resonance frequencies of the indenter and the piezoelectric acoustic emission sensor may be attuned to one another.

Method 500 may comprise an optional act of electrically examining the semiconductor substrate using an electrical examination component, wherein the indenter is configured to electrically couple the electrical examination component to an electrical contact on the semiconductor substrate.

Method 500 may further comprise an optional act of recording in real-time at which strength of the force exercised on the semiconductor substrate the crack occurs.

According to an example, exercising the force comprises increasing the force until the crack occurs. According to another example, the force is in the range of 10 mN to 400 mN. According to another example, the semiconductor substrate is electrically examined before the crack occurs or it is electrically examined after the crack occurs.

In method 500 the acoustic signal may be in the range of 50 kHz to 1 MHz. In method 500 the resonance frequencies of the indenter and the piezoelectric acoustic emission sensor may be in the range of 100 kHz to 200 kHz.

Figure 6:
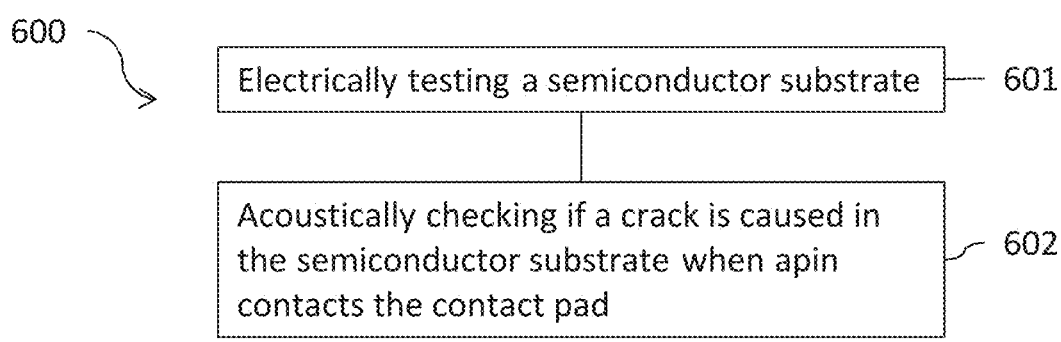
FIG. 6 shows a flow chart of a method for testing a semiconductor substrate according to the disclosure.

FIG. 6 shows a flow chart of a method 600 for testing a semiconductor substrate. According to an example, anyone of the system 100, the indenters 300 and 350 or the array of test pins 400 may be used in the method 600.

Method 600 comprises a first act 601 of electrically testing a semiconductor substrate. Act 601 may comprise contacting a contact pad on the semiconductor substrate with a test pin and electrically coupling an electrical examination component to the contact pad via the test pin. The test pin may e.g. correspond to the indenter 110.

Method 600 comprises a second act 602 of acoustically checking if a crack is caused in the semiconductor substrate when the pin contacts the contact pad. The checking for a crack may comprise transmitting an acoustic signal caused by a crack to an acoustic emission sensor via the test pin.

According to an example of the method 600, the acts 601 and 602 may be performed simultaneously.

The following examples further detail a system and a method for examining semiconductor substrates.

Example 1 is a system for examining semiconductor substrates, the system comprising an indenter configured to exercise a force onto the semiconductor substrate such that a crack in the semiconductor substrate occurs, a piezoelectric acoustic emission sensor configured to detect an acoustic signal emitted by the crack, and attaching means configured to fasten the indenter to a first surface of the piezoelectric acoustic emission sensor, wherein the indenter and the attaching means are configured to transmit the acoustic signal to the piezoelectric acoustic emission sensor, and wherein the resonance frequencies of the indenter and the piezoelectric acoustic emission sensor are attuned to one another.

In Example 2, the subject matter of Example 1 can optionally include that the indenter comprises an indenter pin and an indenter base, wherein the indenter base has a larger diameter than the indenter pin and wherein the attaching means are arranged on the indenter base, and wherein the indenter pin and the indenter base are made of one piece.

In Example 3, the subject matter of Example 1 can optionally include that the indenter comprises an indenter pin and an indenter base, wherein the indenter base has a larger diameter than the indenter pin and wherein the attaching means are arranged on the indenter base, and wherein the indenter pin and the indenter base are two separate pieces that are glued together.

In Example 4, the subject matter of one of the previous Examples can optionally include an electrical examination component, configured to electrically examine the semiconductor substrate, wherein the indenter is configured to electrically couple the electrical examination component to an electrical contact pad on the semiconductor substrate.

In Example 5, the subject matter of Example 4 can optionally include that the system is configured to simultaneously examine the semiconductor substrate acoustically and electrically.

In Example 6, the subject matter of one of the previous Examples can optionally include that the acoustic signal is in the range of 50 kHz to 1 MHz.

In Example 7, the subject matter of one of the previous Examples can optionally include that the resonance frequencies of the indenter and the piezoelectric acoustic emission sensor are in the range of 100 kHz to 200 kHz.

In Example 8, the subject matter of one of the previous Examples can optionally include that the indenter has a length in the range of 10 mm to 15 mm and a diameter in the range of 0.8 mm to 1.5 mm, wherein a tip of the indenter has a diameter in the range of 10 μm to 20 μm.

In Example 9, the subject matter of Example 8 can optionally include that the tip of the indenter comprises diamond.

In Example 10, the subject matter of one of the previous Examples can optionally include that the attaching means comprise a hard glue layer, or a soft solder layer, or mechanical fixing means.

In Example 11, the subject matter of Example 10 can optionally include that the attaching means comprise the hard glue layer, wherein the hard glue layer comprises cyanoacrylate.

Example 12, is a method for examining a semiconductor substrate, the method comprising: exercising a force onto the semiconductor substrate using an indenter, such that a crack in the semiconductor substrate occurs, and detecting an acoustic signal emitted by the crack using a piezoelectric acoustic emission sensor, wherein the indenter is fastened to a first surface of the piezoelectric acoustic emission sensor using a hard glue layer, or a soft solder layer, or a mechanical fixing means, wherein the indenter and the hard glue layer, or the soft solder layer, or the mechanical fixing means are configured to transmit the acoustic signal to the piezoelectric acoustic emission sensor, and wherein the resonance frequencies of the indenter and the piezoelectric acoustic emission sensor are attuned to one another.

In Example 13, the subject matter of Example 12 can optionally include electrically examining the semiconductor substrate using an electrical examination component, wherein the indenter is configured to electrically couple the electrical examination component to an electrical contact on the semiconductor substrate.

In Example 14, the subject matter of Examples 12 or 13 can optionally include that exercising the force comprises increasing the force until the crack occurs.

In Example 15, the subject matter of Example 14 can optionally include that the force is in the range of 10 mN to 400 mN.

In Example 16, the subject matter of Example 13 can optionally include that the semiconductor substrate is electrically examined before or after the crack occurs.

In Example 17, the subject matter of Examples 12 to 16 can optionally include that the acoustic signal is in the range of 50 kHz to 1 MHz.

In Example 18, the subject matter of Examples 12 to 17 can optionally include that the resonance frequencies of the indenter and the piezoelectric acoustic emission sensor are in the range of 100 kHz to 200 kHz.

In Example 19, the subject matter of Examples 12 to 18 can optionally include recording in real-time at which strength of the force exercised on the semiconductor substrate the crack occurs.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A system for examining semiconductor substrates, the system comprising:
   an indenter configured to exercise a force onto the semiconductor substrate such that a crack in the semiconductor substrate occurs;
   a piezoelectric acoustic emission sensor configured to detect an acoustic signal emitted by the crack; and
   attaching means configured to fasten the indenter to a first surface of the piezoelectric acoustic emission sensor,
   wherein the indenter and the attaching means are configured to transmit the acoustic signal to the piezoelectric acoustic emission sensor, and
   wherein the resonance frequencies of the indenter and the piezoelectric acoustic emission sensor are attuned to one another.

2. The system of claim 1, wherein the indenter comprises an indenter pin and an indenter base,
   wherein the indenter base has a larger diameter than the indenter pin and wherein the attaching means are arranged on the indenter base, and
   wherein the indenter pin and the indenter base are made of one piece.

3. The system of claim 1, wherein the indenter comprises an indenter pin and an indenter base,
   wherein the indenter base has a larger diameter than the indenter pin and wherein the attaching means are arranged on the indenter base, and
   wherein the indenter pin and the indenter base are two separate pieces that are glued together.

4. The system of claim 1, further comprising:
   an electrical examination component, configured to electrically examine the semiconductor substrate,
   wherein the indenter is configured to electrically couple the electrical examination component to an electrical contact pad on the semiconductor substrate.

5. The system of claim 4, wherein the system is configured to simultaneously examine the semiconductor substrate acoustically and electrically.

6. The system of claim 1, wherein the acoustic signal is in the range of 50 kHz to 1 MHz.

7. The system of claim 1, wherein the resonance frequencies of the indenter and the piezoelectric acoustic emission sensor are in the range of 100 kHz to 200 kHz.

8. The system of claim 1, wherein the indenter has a length in the range of 10 mm to 15 mm and a diameter in the range of 0.8 mm to 1.5 mm, and wherein a tip of the indenter has a diameter in the range of 10 μm to 20 μm.

9. The system of claim 8, wherein the tip of the indenter comprises diamond.

10. The system of claim 1, wherein the attaching means comprise a hard glue layer, or a soft solder layer, or mechanical fixing means.

11. The system of claim 10, wherein the attaching means comprise the hard glue layer and wherein the hard glue layer comprises cyanoacrylate.

12. A method for examining a semiconductor substrate, the method comprising:
    exercising a force onto the semiconductor substrate using an indenter, such that a crack in the semiconductor substrate occurs; and
    detecting an acoustic signal emitted by the crack using a piezoelectric acoustic emission sensor,
    wherein the indenter is fastened to a first surface of the piezoelectric acoustic emission sensor using a hard glue layer, or a soft solder layer, or a mechanical fixing means,
    wherein the indenter and the hard glue layer, or the soft solder layer, or the mechanical fixing means are configured to transmit the acoustic signal to the piezoelectric acoustic emission sensor, and
    wherein the resonance frequencies of the indenter and the piezoelectric acoustic emission sensor are attuned to one another.

13. The method of claim 12, further comprising:
    electrically examining the semiconductor substrate using an electrical examination component,
    wherein the indenter is configured to electrically couple the electrical examination component to an electrical contact on the semiconductor substrate.

14. The method of claim 12, wherein exercising the force comprises increasing the force until the crack occurs.

15. The method of claim 14, wherein the force is in the range of 10 mN to 400 mN.

16. The method of claim 13, wherein the semiconductor substrate is electrically examined before or after the crack occurs.

17. The method of claim 12, wherein the acoustic signal is in the range of 50 kHz to 1 MHz.

18. The method of claim 12, wherein the resonance frequencies of the indenter and the piezoelectric acoustic emission sensor are in the range of 100 kHz to 200 kHz.

19. The method of claim 12, further comprising:
recording in real-time at which strength of the force exercised on the semiconductor substrate the crack occurs.

\* \* \* \* \*